United States Patent
Yuan et al.

(10) Patent No.: US 10,921,479 B2
(45) Date of Patent: Feb. 16, 2021

(54) MAGNETIC INDUCTION INTENSITY DETECTION DEVICE AND TERMINAL EQUIPMENT

(71) Applicants: BOE Technology Group Co., Ltd., Beijing (CN); Chengdu BOE Optoelectronics Technology Co., Ltd., Sichuan (CN)

(72) Inventors: De Yuan, Beijing (CN); Weilong Zhou, Beijing (CN); Jiangtao Deng, Beijing (CN)

(73) Assignees: BOE Technology Group Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 414 days.

(21) Appl. No.: 16/072,737

(22) PCT Filed: Feb. 2, 2018

(86) PCT No.: PCT/CN2018/075139
§ 371 (c)(1),
(2) Date: Jul. 25, 2018

(87) PCT Pub. No.: WO2018/214595
PCT Pub. Date: Nov. 29, 2018

(65) Prior Publication Data
US 2020/0393592 A1    Dec. 17, 2020

(30) Foreign Application Priority Data

May 23, 2017 (CN) .......................... 201720579655.8

(51) Int. Cl.
*G01V 3/10* (2006.01)
*G01R 33/09* (2006.01)
(Continued)

(52) U.S. Cl.
CPC ............. *G01V 3/10* (2013.01); *G01R 33/093* (2013.01); *G01R 33/3858* (2013.01); *G01R 33/0283* (2013.01)

(58) Field of Classification Search
CPC ........ G01N 21/66; G01V 3/10; G01R 33/093; G01R 33/0283; G01R 33/3858
(Continued)

(56) References Cited

U.S. PATENT DOCUMENTS

2008/0259322 A1* 10/2008 Korotkov ............. A61B 5/0059
356/237.1
2010/0065429 A1* 3/2010 Mount ............... G01N 21/1717
204/547

(Continued)

FOREIGN PATENT DOCUMENTS

CN 2906701 Y 5/2007
CN 101858961 A 10/2010
(Continued)

OTHER PUBLICATIONS

International Search Report PCT/CN2018/075139 dated Mar. 27, 2018.
(Continued)

*Primary Examiner* — Christopher P McAndrew
(74) *Attorney, Agent, or Firm* — Arent Fox LLP; Michael Fainberg

(57) ABSTRACT

The disclosure discloses a magnetic induction intensity detection device and a terminal equipment. The magnetic induction intensity detection device provided by an embodiment of the disclosure includes: a power supply, an electroluminescence component and a current detection component, wherein the electroluminescence component and the current detection component are connected in series; the power supply is configured to supply a voltage to the (Continued)

electroluminescence component so that the electroluminescence component generates a current; the current detection component is configured to detect a current variation flowing through the electroluminescence component, and determine a current magnetic induction intensity according to the current variation and a correspondence between current variations and magnetic induction intensities.

20 Claims, 4 Drawing Sheets

(51) Int. Cl.
*G01R 33/385* (2006.01)
*G01R 33/028* (2006.01)
*G01N 21/66* (2006.01)

(58) Field of Classification Search
USPC ............................................. 324/228
See application file for complete search history.

(56) References Cited

U.S. PATENT DOCUMENTS

2010/0182421 A1* 7/2010 Chidambaram ....... G01N 21/66
   348/126
2014/0001058 A1* 1/2014 Ghaffari ................ G01N 27/02
   205/792

FOREIGN PATENT DOCUMENTS

| CN | 105652654 A | 6/2016 |
| CN | 206945930 U | 1/2018 |
| WO | 2004107405 A | 12/2004 |

OTHER PUBLICATIONS

Chinese Office Action for 201720579655.8 dated Nov. 7, 2017.
Jia et al. "Progress in magneto-conductance effect of organic light-emitting diode" Infrared and Laser Engineering, Jan. 31, 2015, pp. 162-169.

* cited by examiner

MAGNETIC INDUCTION INTENSITY DETECTION DEVICE AND TERMINAL EQUIPMENT

The present application is a National Stage of International Application No. PCT/CN2018/075139, filed Feb. 2, 2018, which claims the priority from Chinese Patent Application No. 201720579655.8, filed with the Chinese Patent Office on May 23, 2017 and entitled "Magnetic Induction Intensity Detection Device and Terminal Equipment", both of which are hereby incorporated by reference in their entireties.

FIELD

The disclosure relates to the technical field of the magnetic induction intensity detection, and particularly to a magnetic induction intensity detection device and a terminal equipment.

BACKGROUND

The magnetic field is ubiquitous in the people's living space, where the magnetic field may have a certain effect on the human health status. It is widely believed that the magnetic field may have a bad effect on the human when the magnetic induction intensity is greater than 10 millitesla (mT). With the development of technology, a variety of automatic electrical equipments arise, but quite a part of equipments may all produce the magnetic field which is harmful to the human body. Thus the magnetic induction intensity in the effective and convenient testing environment facilitates the people to actively avoid the harm caused by the magnetic field to the human body. However, the magnetic field testing devices in the related art are mostly based on the Hall effect, and the magnetic induction intensity measuring devices are generally more complex, have rather large volumes and is inconvenient to carry in the daily life. Also, in the related art, the test result of the magnetic induction intensity is influenced by the magnetic field direction, and the device application is limited.

BRIEF SUMMARY

Embodiments of the disclosure provide a magnetic induction intensity detection device and a terminal equipment.

At an aspect, an embodiment of the disclosure provides a magnetic induction intensity detection device, which includes: a power supply, an electroluminescence component and a current detection component, wherein the electroluminescence component and the current detection component are connected in series;

the power supply is configured to supply a voltage to the electroluminescence component so that the electroluminescence component generates a current;

the current detection component is configured to detect a current variation flowing through the electroluminescence component, and determine a current magnetic induction intensity according to the current variation and a correspondence between current variations and magnetic induction intensities.

Optionally, the current detection component includes an amperemeter.

Optionally, the electroluminescence component includes a substrate, a first electrode layer located on the substrate, an organic layer located on the first electrode layer, a second electrode layer located on the organic layer, and an encapsulation layer which cooperates with the substrate to encapsulate the first electrode layer, the organic layer and the second electrode layer.

Optionally, the encapsulation layer includes one or a combination of: glass and glass glue, a laminated film of a polymer and an inorganic film.

Optionally, the material of the first electrode layer includes one or a combination of: aluminum, silver, magnesium silver alloy.

Optionally, the material of the second electrode layer includes one or a combination of: indium tin oxide, gold.

Optionally, the organic layer includes: a hole injection layer, a hole transmission layer located on the hole injection layer, a light emitting layer located on the hole transmission layer, and an electron injection layer located on the light emitting layer.

Optionally, a material of the hole injection layer includes one or a combination of: copper phthalocyanine; 4,4',4"-tris (N-3-methylphenyl-N-phenylamino)m-MTDATA; poly(3, 4-ethylene-dioxythiophene):poly(styrenesulfonate).

Optionally, a material of the hole transmission layer includes one or a combination of: N,N'-Di(naphthalen-1-yl)-N,N'-diphenylbenzidine; N,N'-diphenyl-N,N'-bis(3-methyl-lphenyl)-(1,1'-biphenyl)-4,4'-diamine; N,N'-diphenyl-N,N'-bis(3-methylphenyl)-1,4-phenylenediamine.

Optionally, a material of the light emitting layer includes one or a combination of: tris-(8-hydroxyquinoline)aluminum(III); 1,3,5-Tri(1-phenyl-1H-benzo[d]imidazol-2-yl) phenyl.

Optionally, a material of the electron injection layer includes one or a combination of: lithium fluoride, cesium fluoride, ytterbium, silicon nitride.

At another aspect, an embodiment of the disclosure provides a terminal equipment, which includes the magnetic induction intensity detection device provided by the embodiments of the disclosure.

Optionally, the terminal equipment is a wearable terminal equipment.

Optionally, the terminal equipment further includes a magnetic induction intensity monitoring module which is configured to determine whether the magnitude of the detected magnetic induction intensity exceeds a selected value according to a detection result, and send an alarm signal when the magnitude of the detected magnetic induction intensity exceeds the selected value.

BRIEF DESCRIPTION OF THE DRAWINGS

In order to illustrate the technical solutions in the embodiments of the disclosure more clearly, the accompanying figures which need to be used in describing the embodiments will be introduced below briefly. Obviously the accompanying figures described below are only some embodiments of the disclosure, and other accompanying figures can also be obtained by those ordinary skilled in the art according to these accompanying figures without creative labor.

DETAILED DESCRIPTION OF THE EMBODIMENTS

The embodiments of the disclosure provide a magnetic induction intensity detection device and a terminal equipment, so as to detect the magnitude of the magnetic induction intensity in the environment effectively and conveniently.

Firstly, the relevant principle of performing the magnetic induction intensity detection by using the magnetic induction intensity detection device provided by the embodiment of the disclosure will be introduced.

Figure 1:
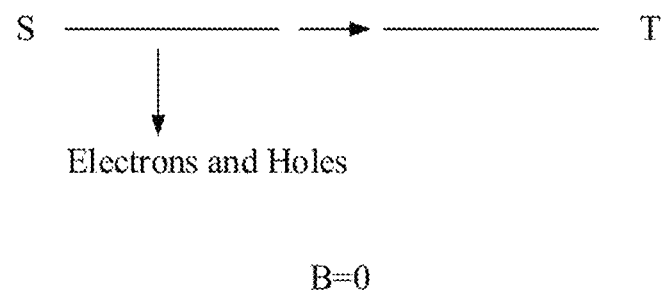
FIG. 1 is a schematic diagram of the conversion from the singlet-state polaron pair S to the triplet-state polaron pair T in the case that the magnetic induction intensity is equal to 0 provided by an embodiment of the disclosure.
Figure 2:
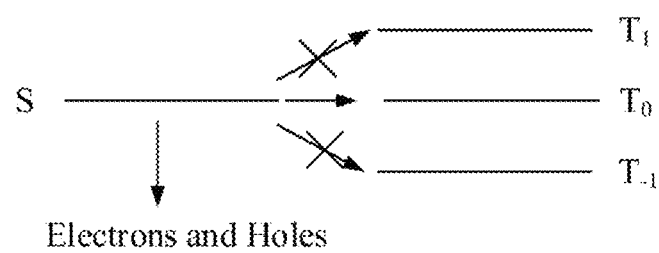
FIG. 2 is a schematic diagram of the conversion from the singlet-state polaron pair S to the triplet-state polaron pair T in the case that the magnetic induction intensity is unequal to 0 provided by an embodiment of the disclosure.

The electroluminescence component contains electroluminescence materials. When the voltage is applied to the electroluminescence component, the electrons and the holes enter into the electroluminescence materials, which may form the singlet-state polaron pair S and the triplet-state polaron pair T, where the triplet-state polaron pair T can be divided into three states $T_1$, $T_0$ and $T_{-1}$. Here, S has stronger ionicity than T, and S is easier to dissociate into a free charge and contribute to the conduction current formed by the electroluminescence component. When there is no magnetic field in the environment, i.e., the magnetic induction intensity B is equal to 0, the energy levels of the singlet-state polaron pair S and the triplet-state polaron pair T are degenerated (the energy levels $T_1$, $T_0$ and $T_{-1}$ overlap), as shown in FIG. 1, so that the singlet-state polaron pair S can be converted into the triplet-state polaron pair T by inter-system crossing. However, under the action of the magnetic field (i.e., B≠0), the triplet-state polaron pair may produce the Zeeman splitting effect to generate three metastates $T_1$, $T_0$ and $T_{-1}$. As shown in FIG. 2, among the three metastates $T_1$, $T_0$ and $T_{-1}$, the energy of only $T_0$ is proximate to that of the singlet-state polaron pair S, while each of $T_1$ and $T_{-1}$ introduces a Zeeman energy with respect to $T_0$, that is, an energy level barrier is introduced among the three metastates of the triplet state. In this case, the conversion of the polaron pair from the S state to the two metastates $T_1$ and $T_{-1}$ is suppressed, and the energy level barrier increases as the magnetic induction intensity increases. Compared with the case of B=0, the intersystem crossing from S to T weakens in case that the magnetic field exists, so that the conversion from the singlet-state polaron pair S to the triplet-state polaron pair T is suppressed, which causes the increased concentration of S so that the number of the electrons and holes split by S increases and the conduction current formed by the electroluminescence component increases. When the voltage applied to the electroluminescence component is constant, the current flowing through the electroluminescence component increases gradually as the magnetic induction intensity increases in a certain range of magnetic induction intensities, that is, the magnetic-induced current effect occurs. When the structure of the electroluminescence component is fixed and the voltage applied to the electroluminescence component is constant, the correspondence between the current variations and the magnetic induction intensities will also be determined therewith. This correspondence can be measured. In the process of detecting the magnetic induction intensity, by detecting the variation of the current flowing through the electroluminescence component, the magnitude of the magnetic induction intensity in the environment can be determined according to this correspondence.

Figure 3:
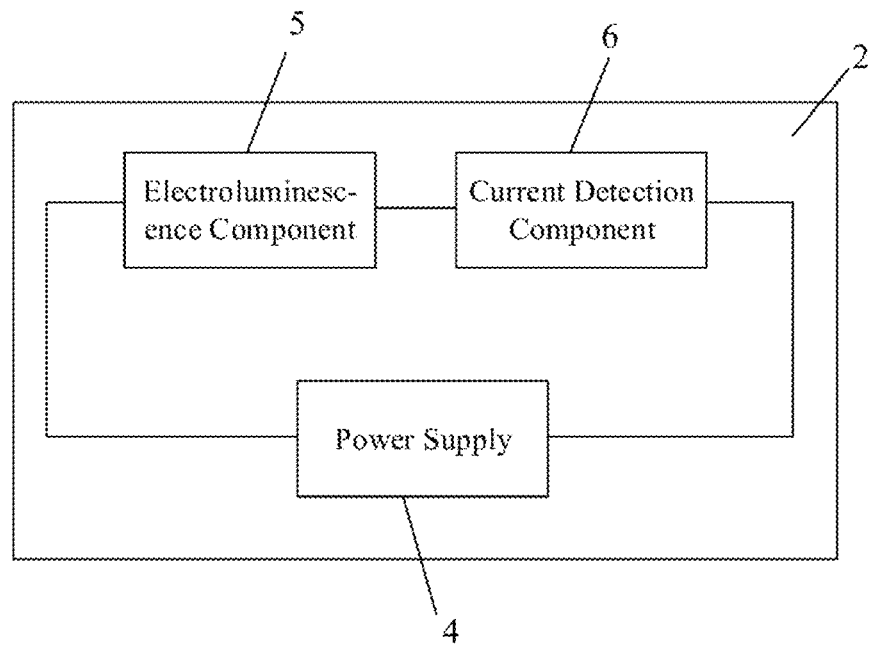
FIG. 3 is a structural schematic diagram of a magnetic induction intensity detection device provided by an embodiment of the disclosure.

A magnetic induction intensity detection device provided by an embodiment of the disclosure is as shown in FIG. 3, where the magnetic induction intensity detection device 2 includes: a power supply 4, an electroluminescence component 5 and a current detection component 6, wherein the electroluminescence component 5 and the current detection component 6 are connected in series.

The power supply 4 is configured to supply a voltage to the electroluminescence component 5 so that the electroluminescence component 5 generates a current therein.

The current detection component 6 is configured to detect a current variation flowing through the electroluminescence component 5, and determine a current magnetic induction intensity according to the current variation and a correspondence between current variations and magnetic induction intensities.

The magnetic induction intensity detection device provided by the embodiment of the disclosure includes: a power supply, an electroluminescence component and a current detection component, where the power supply supplies a voltage to the electroluminescence component so that the latter generates a current. In the case that the magnetic field exists, since the electroluminescence component produces the magnetic-induced current effect, the current flowing through the electroluminescence component changes, so that the current variation is detected by the current detection component and the magnitude of the magnetic induction intensity in the current environment can be determined according to the correspondence between the current variations and the magnetic induction intensities. Thus, the magnetic induction intensity detection device provided by the embodiment of the disclosure is based on the magnetic-induced current effect, the principle is simple and easy to be implemented, and the correspondence between the current variations and the magnetic induction intensities is easy to be determined, so that the magnetic induction intensity detection device provided by the embodiment of the disclosure is simple in structure, small in volume and easy to carry, and the user can utilize the magnetic induction intensity detection device provided by the embodiment of the disclosure to detect the magnitude of the magnetic induction intensity in the environment effectively, conveniently and flexibly.

Optionally, for the magnetic induction intensity detection device provided by the embodiment of the disclosure, the correspondence between the current variations and the magnetic induction intensities can be preset. When the constant voltage provided by the power supply to the electroluminescence component is determined, the correspondence between the current variations flowing through the electroluminescence component and the magnetic induction intensities will also be determined therewith, so that this correspondence between the current variations flowing through the electroluminescence component and the magnetic induction intensities can be taken as the correspondence between the current variations and the magnetic induction intensities. When the magnetic induction intensity detection device is under the action of the magnetic field, the magnitude of the magnetic induction intensity in the current environment can be determined by comparing the measured current variation with the correspondence between the current variations and the magnetic induction intensities.

Optionally, in the magnetic induction intensity detection device provided by the embodiment of the disclosure, the electroluminescence component, the current detection component and the power supply can be connected by wires. The electroluminescence component can be for example an Organic Light-Emitting Diode (OLED). The power supply can be for example a battery.

Optionally, in the magnetic induction intensity detection device provided by the embodiment of the disclosure, the current detection component includes an amperemeter. For example, it can be a precise and small amperemeter which can detect the current variation precisely.

Optionally, in the magnetic induction intensity detection device provided by the embodiment of the disclosure, when the voltage supplied by the power supply to the electroluminescence component structure is fixed, the correspondence between the current variations flowing through the electroluminescence component and the magnetic induction intensities is also fixed, and this correspondence can be obtained in advance, that is, the current variation of the electroluminescence component with the change of the magnetic induction intensity can be predetermined. When the magnetic induction intensity detection device provided by the embodiment of the disclosure is under the action of the magnetic field, the current flowing through the electroluminescence component will change comparing with the case that the magnetic induction intensity is equal to 0. The current flowing through the electroluminescence component can be detected by the amperemeter precisely, and then the current variation can be determined in combination with the current which flows through the electroluminescence component when the magnetic induction intensity is equal to 0.

In the actual application, the magnetic induction intensity detection device provided by the embodiment of the disclosure can modify the number displayed by the scale of the amperemeter into the corresponding magnitude of the magnetic induction intensity according to the correspondence between the current variations and the magnetic induction intensities, so that the magnitude of the magnetic induction intensity in the current environment can be displayed only by the amperemeter in case that there is no need to arrange other components.

Of course, other components can also be arranged according to the actual situation, and cooperate with the amperemeter to determine the magnitude of the magnetic induction intensity in the current environment. For example, when the magnetic induction intensity detection device is provided with a display screen, the current detection component can be provided with a chip storing the correspondence between the current variations and the magnetic induction intensities, where the chip can read the detection data of the amperemeter and determine the current variation, and then output the magnitude of the magnetic induction intensity in the current environment according to the correspondence between the current variations and the magnetic induction intensities, so that the magnitude of the magnetic induction intensity is displayed on the display screen of the magnetic induction intensity detection device.

Figure 4:
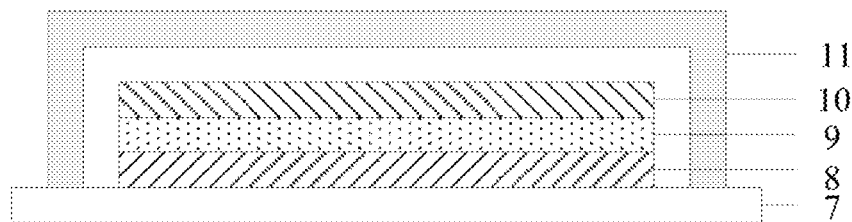
FIG. 4 is a structural schematic diagram of an electroluminescence component provided by an embodiment of the disclosure.

Optionally, in the magnetic induction intensity detection device provided by the embodiment of the disclosure, as shown in FIG. 4, the electroluminescence component 5 generally includes: a substrate 7, a first electrode layer 8 located on the substrate 7, an organic layer 9 located on the first electrode layer 8, a second electrode layer 10 located on the organic layer 9, and an encapsulation layer 11 which cooperates with the substrate 7 to encapsulate the first electrode layer 8, the organic layer 9 and the second electrode layer 10. The first electrode layer 8, the organic layer 9 and the second electrode layer 10 are encapsulated to thereby prevent the water oxygen from destroying the first electrode layer 8, the organic layer 9 and the second electrode layer 10, thus increasing the operation stability of the electroluminescence component 5.

When the electroluminescence component 5 as shown in FIG. 4 is used to sense the magnetic induction intensity, the positive and negative poles of the power supply 4 are connected to the first electrode layer 8 and the second electrode layer 10 of the electroluminescence component 5 respectively, so that the electroluminescence component 5 generates a current when the power supply 4 applies the voltage.

Optionally, the material of the substrate includes one or a combination of: glass, plastic. Of course, other materials can also be used. In the magnetic induction intensity detection device provided by the embodiment of the disclosure, the substrate of the electroluminescence component can be a flexible substrate, or can be a non-flexible substrate. The material of the substrate of the electroluminescence component can be selected according to the practical application situation of the magnetic induction intensity detection device.

The first electrode layer, the organic layer and the second electrode layer are encapsulated, for example, by using the glass encapsulation (using the glass glue and glass to encapsulate) or the thin-film encapsulation (using the laminated film of a polymer and an inorganic film to encapsulate). Optionally, the encapsulation layer includes one or a combination of: glass and glass glue, a laminated film of a polymer and an inorganic film. Here, the inorganic film can be for example the silicon oxynitride film.

Optionally, the material of the first electrode layer includes one or a combination of: aluminum (Al), silver (Ag), magnesium silver alloy. Of course, the first electrode layer can also use other materials, which is not limited here.

Optionally, the material of the second electrode layer includes one or a combination of: indium tin oxide (ITO), gold (Au). Of course, the second electrode layer can also use other materials, which is not limited here.

Figure 5:
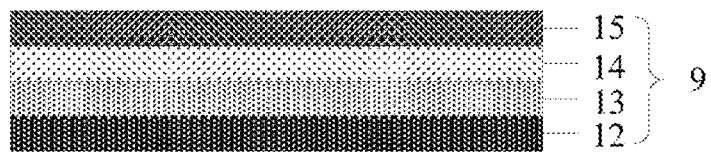
FIG. 5 is a structural schematic diagram of a light emitting layer provided by an embodiment of the disclosure.

Optionally, as shown in FIG. 5, the organic layer 9 includes: a hole injection layer 12, a hole transmission layer 13 located on the hole injection layer 12, a light emitting layer 14 located on the hole transmission layer 13, and an electron injection layer 15 located on the light emitting layer 14.

Optionally, the material of the hole injection layer includes one or a combination of: copper phthalocyanine (CuPc); 4, 4', 4"-tris (N-3-methylphenyl-N-phenylamino) m-MTDATA; poly (3,4-ethylene-dioxythiophene): poly (styrenesulfonate) (PEDOT:PSS). Of course, the hole injection layer can also use other materials, which is not limited here.

Optionally, the material of the hole transmission layer includes one or a combination of: N,N'-Di(naphthalen-1-yl)-N,N'-diphenylbenzidine (NBP); N,N'-diphenyl-N,N'-bis(3-methylphenyl)-(1,1'-biphenyl)-4,4'-diamine (TPD); N,N'-diphenyl-N,N'-bis(3-methylphenyl)-1,4-phenylenediamine (TTP). Of course, the hole transmission layer can also use other materials, which is not limited here.

Optionally, the material of the light emitting layer includes one or a combination of: tris-(8-hydroxyquinoline) aluminum(III) (Alq3); 1,3,5-Tri(1-phenyl-1H-benzo[d]imidazol-2-yl) phenyl (TPBI). Of course, the light emitting layer can also use other electroluminescence materials, which is not limited here.

Optionally, the material of the electron injection layer includes one or a combination of: lithium fluoride (LiF), cesium fluoride (CsF), ytterbium (Yb), silicon nitride ($Si_3N_4$). Of course, the electron injection layer can also use other materials, which is not limited here.

It is necessary to note that the organic layer provided by the embodiment of the disclosure can further include an electron transmission layer which is arranged between the light emitting layer and the electron injection layer. When the Alq3 is used as the material of the light emitting layer, the Alq3 can further serve as the electron transmission layer, so the electroluminescence structure can enable the electrons to pass to the light emitting layer without the extra arrangement of other materials as the electron transmission layer. In an actual application, whether to arrange the electron transmission layer between the light emitting layer and the electron injection layer can be determined according to the material of the light emitting layer. Optionally, the material of the electron transmission layer can be one or a combination of: tris-[3-(3-pyridyl)mesityl]borane (3TPYMB); 2,8-bis(diphenylphosphoryl)dibenzo-[b,d] thiophene (PPT) and the like.

It is necessary to note that, for different electroluminescence components, the correspondences between the current variations and the magnetic induction intensity magnitudes are also different when the voltage supplied by the power supply is fixed. The changes of the materials of the second electrode layer, the organic layer and the first electrode layer of the electroluminescence component and the change of the thickness of each film layer may influence the correspondence between the current variations and the magnetic induction intensity magnitudes, and the correspondence between the current variations and the magnetic induction intensities needs to be determined according to the specific structure of the electroluminescence component.

The test situation of the correspondence between the current variations and the magnetic induction intensities for the electroluminescence component provided by the embodiment of the disclosure will be illustrated below.

Figure 6:
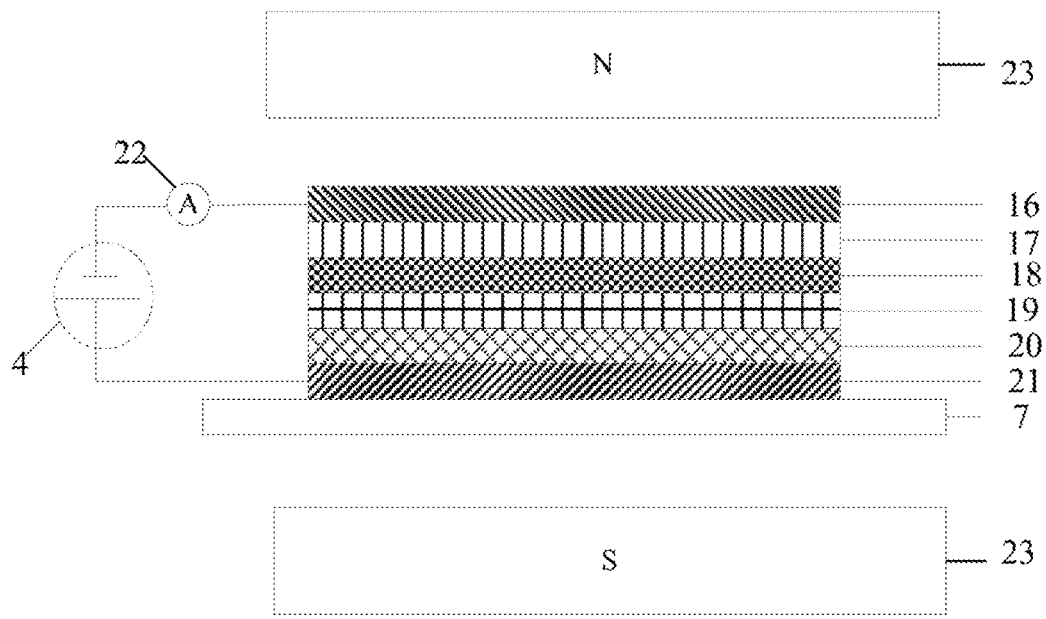
FIG. 6 is a schematic diagram of performing the detection of the magnetic-induced current effect on the electroluminescence component provided by an embodiment of the disclosure.

As shown in FIG. 6, the electroluminescence component under test includes: the substrate 7, ITO 16, CuPc 17 with the thickness of 15 nm, NPB 18 with the thickness of 60 nm, Alq3 19 with the thickness of 80 nm, LiF 20 with the thickness of 1 nm, and Al 21 with the thickness of 120 nm. The positive and negative poles of the power supply 4 are connected to the Al 21 and ITO 16 of the electroluminescence component respectively, and the voltage of the power supply 4 is adjustable. The amperemeter 22 can detect the magnitude of the current flowing through the electroluminescence component. The whole electroluminescence component is arranged between the N and S poles of the electromagnet 23, and the magnitude and the direction of the magnetic induction intensity of the electromagnet are adjustable.

Figure 7:
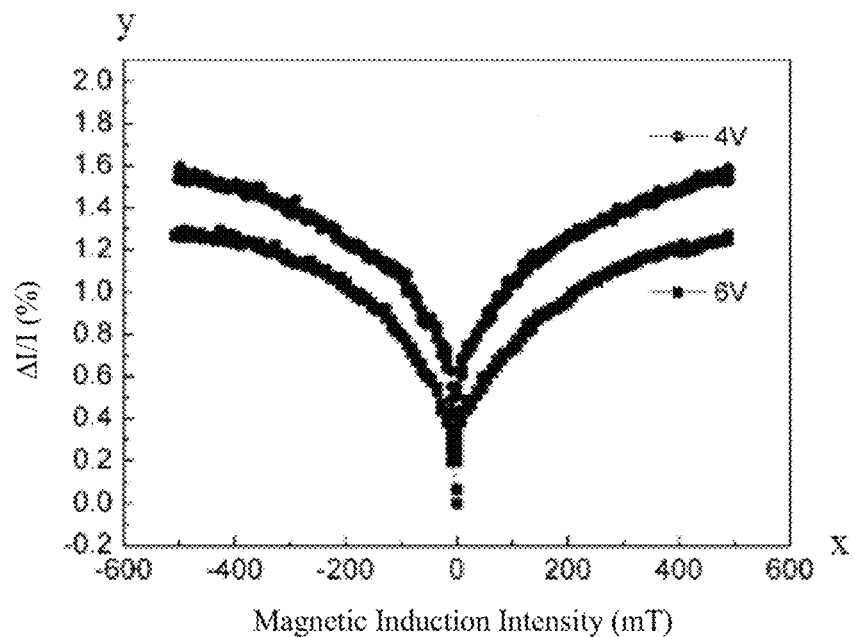
FIG. 7 is a schematic diagram of a curve for reflecting the correspondence between the relative current variations and the magnetic induction intensities provided by an embodiment of the disclosure.

The test result of the correspondence between the current variations and the magnetic induction intensities for the electroluminescence component is as shown in FIG. 7, where the lateral axis x of the image represents the magnitude of the magnetic induction intensity, and the positive and negative represent the magnetic field direction; and the longitudinal axis y of the image represents the relative variation $\Delta I/I$ of the current with the magnetic field. The relative variation of the current is defined as:

$$\frac{\Delta I}{I} = \frac{I(t) - I(0)}{I(0)} \times 100\%.$$

In the formula, I(t) is the current flowing through the electroluminescence component when the magnetic induction intensity of the external magnetic field is t, and I(0) is the current flowing through the electroluminescence component when the magnetic induction intensity is 0.

As can be seen from FIG. 7, when the voltage across the electroluminescence component is 4V and 6V respectively, the correspondence between the current variations and the magnetic induction intensities for the electroluminescence component varies. But when the structure of the electroluminescence component is fixed and the voltage across the electroluminescence component is constant, the electroluminescence component will possess the fixed curve of the correspondence between the current variations and the magnetic induction intensities, so the magnitude of the magnetic induction intensity in the environment where the electroluminescence component is located can be determined by detecting the current variation of the electroluminescence component. As can also be seen from FIG. 7, the relation curve of the current variations and the magnetic induction intensities is bilaterally symmetric about the symmetry axis of x=0, that is, the relative variation of the current is independent of the direction of the magnetic induction intensity.

It is necessary to note that the plane of the electroluminescence component is perpendicular to the direction of the magnetic induction intensity in FIG. 6. When the arranging direction of the electroluminescence component is changed so that the plane of the electroluminescence component is parallel to the direction of its induction intensity, the obtained relation curve of the relative current variations and the magnetic induction intensities is the same as the relation curve of the relative current variations and the magnetic induction intensities when the plane of the electroluminescence component is perpendicular to the direction of the magnetic induction intensity, that is, the magnitude of the magnetic induction intensity detected by the electroluminescence component in the environment is not be affected by the direction of the magnetic induction intensity. The magnetic induction intensity detection device provided by the embodiment of the disclosure, which is based on the electroluminescence component, is more flexible and convenient in the application of testing the magnitude of the magnetic induction intensity.

Furthermore, as can be seen from FIG. 7, the electroluminescence component provided by the embodiment of the disclosure is used to detect the magnitude of the magnetic induction intensity, where the detection range is 0 to 500 mT, which completely satisfies the detections of the magnetic induction intensities of the common magnetic fields in the daily life and work.

Based on the same inventive concept, an embodiment of the disclosure further provides a terminal equipment, which includes the magnetic induction intensity detection device provided by the embodiments of the disclosure. The principle of solving the problem by the terminal equipment is similar to that of the magnetic induction intensity detection device described above, so the implementations of the terminal equipment can refer to the implementations of the magnetic induction intensity detection device described above, and the repeated description thereof will be omitted here.

Optionally, since the terminal equipment provided by the embodiment of the disclosure includes the magnetic induction intensity detection device, the user can utilize the terminal equipment to detect the magnitude of the magnetic induction intensity in the environment effectively, conveniently and flexibly.

Figure 8:
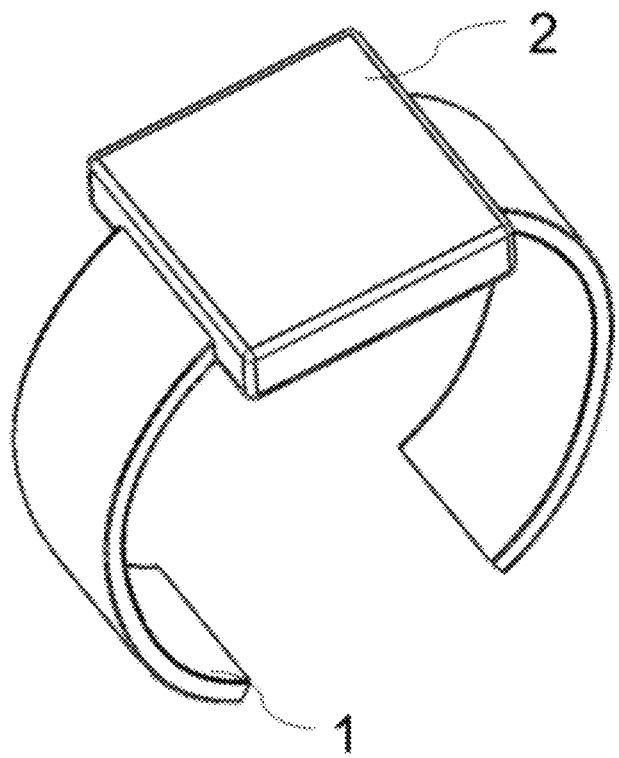
FIG. 8 is a structural schematic diagram of a terminal equipment provided by an embodiment of the disclosure.

Optionally, the terminal equipment is a wearable terminal equipment. As shown in FIG. 8, the wearable terminal equipment includes a bracelet 1 and a magnetic induction intensity detection device 2. Of course, the wearable terminal equipment can also be a belt, a cap or another device which is easy for the user to carry.

The terminal equipment provided by the embodiment of the disclosure can also be, for example, a mobile phone, a tablet. The mobile phone or tablet includes the magnetic induction intensity detection device therein, and the user can detect the magnitude of the magnetic induction intensity in the current environment when using the mobile phone or tablet. Of course, the terminal equipment can also be another device which is easy for the user to carry.

Optionally, the terminal equipment further includes a magnetic induction intensity monitoring module which is configured to determine whether the magnitude of the detected magnetic induction intensity exceeds a selected value according to a detection result, and send an alarm signal when the magnitude of the detected magnetic induction intensity exceeds the selected value.

It is necessary to note that the selected value can be set according to the actual situation. For example, when the terminal equipment is used to prevent the magnetic field from affecting the human health, the selected value can be set to 10 mT. When the magnetic induction intensity detected by the terminal equipment provided by the embodiment of the disclosure in the environment exceeds 10 mT, the monitoring module sends an alarm signal to remind the user of the event that the magnetic field in the current environment may damage the human health, and remind the user of leaving from the current environment, which facilitates the user to avoid the damage caused by the magnetic field to the human health actively and timely.

The alarm signal sent by the monitoring module can be, for example, an acoustical signal, an optical signal, a vibration or the combination thereof.

In conclusion, the magnetic induction intensity detection device provided by the embodiment of the disclosure includes: a power supply, an electroluminescence component and a current detection component, where the power supply supplies a voltage to the electroluminescence component so that the latter generates a current. In the case that the magnetic field exists, since the electroluminescence component produces the magnetic-induced current effect, the current flowing through the electroluminescence component changes, so that the current variation is detected by the current detection component and the magnitude of the magnetic induction intensity in the current environment can be determined according to the correspondence between the current variations and the magnetic induction intensities. Thus, the magnetic induction intensity detection device provided by the embodiment of the disclosure is based on the magnetic-induced current effect, the principle is simple and easy to be implemented, and the correspondence between the current variations and the magnetic induction intensities is easy to be determined, so that the magnetic induction intensity detection device provided by the embodiment of the disclosure is simple in structure, small in volume and easy to carry, and the user can utilize the magnetic induction intensity detection device provided by the embodiment of the disclosure to detect the magnitude of the magnetic induction intensity in the environment effectively, conveniently and flexibly. Also, when detecting the magnitude of the magnetic induction intensity, the magnetic induction intensity detection device provided by the embodiment of the disclosure is not affected by the direction of the magnetic induction intensity, so that the application of the magnetic induction intensity detection device is more flexible. For the magnetic induction intensity detection device provided by the embodiment of the disclosure, when the current detection component includes an amperemeter, the magnitude of the magnetic induction intensity in the current environment can be read by the modified amperemeter without the arrangement of other components. Since the terminal equipment provided by the embodiment of the disclosure includes the magnetic induction intensity detection device, the user can utilize the terminal equipment to detect the magnitude of the magnetic induction intensity in the environment effectively, conveniently and flexibly. Since the terminal equipment provided by the embodiment of the disclosure is provided with the magnetic induction intensity monitoring component, the monitoring module sends the alarm signal when the magnitude of the magnetic induction intensity in the environment exceeds the selected value, to remind the user of the event that the magnetic field in the current environment is detrimental to the human health, and facilitate the user to avoid the damage caused by the magnetic field to the human health actively and timely.

Evidently those skilled in the art can make various modifications and variations to the disclosure without departing from the spirit and scope of the disclosure. Thus the disclosure is also intended to encompass these modifications and variations to the disclosure as long as these modifications and variations come into the scope of the claims of the disclosure and their equivalents.

What is claimed is:

1. A magnetic induction intensity detection device, comprising: a power supply, an electroluminescence component and a current detection component, wherein the electroluminescence component and the current detection component are connected in series;
   the power supply is configured to supply a voltage to the electroluminescence component so that the electroluminescence component generates a current;
   the current detection component is configured to detect a current variation flowing through the electroluminescence component, and determine a current magnetic induction intensity according to the current variation and a correspondence between current variations and magnetic induction intensities.

2. The magnetic induction intensity detection device according to claim 1, wherein the current detection component comprises an amperemeter.

3. The magnetic induction intensity detection device according to claim 1, wherein the electroluminescence component comprises a substrate, a first electrode layer located on the substrate, an organic layer located on the first electrode layer, a second electrode layer located on the organic layer, and an encapsulation layer which cooperates with the substrate to encapsulate the first electrode layer, the organic layer and the second electrode layer.

4. The magnetic induction intensity detection device according to claim 3, wherein the encapsulation layer comprises one or a combination of: glass and glass glue, a laminated film of a polymer and an inorganic film.

5. The magnetic induction intensity detection device according to claim 3, wherein a material of the first electrode layer comprises one or a combination of: aluminum, silver, magnesium silver alloy.

6. The magnetic induction intensity detection device according to claim 3, wherein a material of the second electrode layer comprises one or a combination of: indium tin oxide, gold.

7. The magnetic induction intensity detection device according to claim 3, wherein the organic layer comprises: a hole injection layer, a hole transmission layer located on the hole injection layer, a light emitting layer located on the hole transmission layer, and an electron injection layer located on the light emitting layer.

8. The magnetic induction intensity detection device according to claim 7, wherein a material of the hole injection layer comprises one or a combination of: copper phthalocyanine; 4,4',4"-tris(N-3-methylphenyl-N-phenylamino)m-MTDATA; poly(3,4-ethylene-dioxythiophene):poly(styrenesulfonate).

9. The magnetic induction intensity detection device according to claim 7, wherein a material of the hole transmission layer comprises one or a combination of: N,N'-Di(naphthalen-1-yl)-N,N'-diphenylbenzidine; N,N'-diphenyl-N,N'-bis(3-methyllphenyl)-(1,1'-biphenyl)-4,4'-diamine; N,N'-diphenyl-N,N'-bis(3-methylphenyl)-1,4-phenylenediamine.

10. The magnetic induction intensity detection device according to claim 7, wherein a material of the light emitting layer comprises one or a combination of: tris-(8-hydroxyquinoline) aluminum(III); 1,3,5-Tri(1-phenyl-1H-benzo[d]imidazol-2-yl)phenyl.

11. The magnetic induction intensity detection device according to claim 7, wherein a material of the electron injection layer comprises one or a combination of: lithium fluoride, cesium fluoride, ytterbium, silicon nitride.

12. A terminal equipment, wherein the terminal equipment comprises the magnetic induction intensity detection device of claim 1.

13. The terminal equipment according to claim 12, wherein the terminal equipment is a wearable terminal equipment.

14. The terminal equipment according to claim 12, wherein the terminal equipment further comprises a magnetic induction intensity monitoring module which is configured to determine whether the magnitude of detected magnetic induction intensity exceeds a selected value according to a detection result, and send an alarm signal when the magnitude of the detected magnetic induction intensity exceeds the selected value.

15. The terminal equipment according to claim 12, wherein the electroluminescence component comprises a substrate, a first electrode layer located on the substrate, an organic layer located on the first electrode layer, a second electrode layer located on the organic layer, and an encapsulation layer which cooperates with the substrate to encapsulate the first electrode layer, the organic layer and the second electrode layer.

16. The terminal equipment according to claim 15, wherein the organic layer comprises: a hole injection layer, a hole transmission layer located on the hole injection layer, a light emitting layer located on the hole transmission layer, and an electron injection layer located on the light emitting layer.

17. The terminal equipment according to claim 16, wherein a material of the hole injection layer comprises one or a combination of: copper phthalocyanine; 4,4',4"-tris(N-3-methylphenyl-N-phenylamino)m-MTDATA; poly(3,4-ethylene-dioxythiophene):poly(styrenesulfonate).

18. The terminal equipment according to claim 16, wherein a material of the hole transmission layer comprises one or a combination of: N,N'-Di(naphthalen-1-yl)-N,N'-diphenylbenzidine; N,N'-diphenyl-N,N'-bis(3-methyllphenyl)-(1,1'-biphenyl)-4,4'-diamine; N,N'-diphenyl-N,N-bis(3-methylphenyl)-1,4-phenylenediamine.

19. The terminal equipment according to claim 16, wherein a material of the light emitting layer comprises one or a combination of: tris-(8-hydroxyquinoline) aluminum(III); 1,3,5-Tri(1-phenyl-1H-benzo[d]imidazol-2-yl)phenyl.

20. The terminal equipment according to claim 16, wherein a material of the electron injection layer comprises one or a combination of: lithium fluoride, cesium fluoride, ytterbium, silicon nitride.

* * * * *